United States Patent
Ho et al.

(10) Patent No.: US 10,636,730 B2
(45) Date of Patent: Apr. 28, 2020

(54) SEMICONDUCTOR PACKAGE AND SEMICONDUCTOR MANUFACTURING PROCESS

(71) Applicant: Advanced Semiconductor Engineering, Inc., Kaohsiung (TW)

(72) Inventors: Cheng-Lin Ho, Kaohsiung (TW); Chih-Cheng Lee, Kaohsiung (TW); Li-Chuan Tsai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 189 days.

(21) Appl. No.: 15/348,899

(22) Filed: Nov. 10, 2016

(65) Prior Publication Data
US 2018/0130759 A1 May 10, 2018

(51) Int. Cl.
*H01L 23/498* (2006.01)
*H01L 21/683* (2006.01)
*H01L 23/16* (2006.01)
*H01L 23/538* (2006.01)
*H01L 23/00* (2006.01)
(Continued)

(52) U.S. Cl.
CPC .... *H01L 23/49811* (2013.01); *H01L 21/6835* (2013.01); *H01L 23/16* (2013.01); *H01L 23/5389* (2013.01); *H01L 24/16* (2013.01); *H01L 24/81* (2013.01); *H01L 21/486* (2013.01); *H01L 21/4857* (2013.01); *H01L 23/3128* (2013.01); *H01L 23/49827* (2013.01); *H01L 23/562* (2013.01); *H01L 24/13* (2013.01); *H01L 2221/68345* (2013.01); *H01L 2224/131* (2013.01); *H01L 2224/13082* (2013.01); *H01L 2224/16238* (2013.01); *H01L 2224/81385* (2013.01); *H01L 2924/15311* (2013.01); *H01L 2924/3511* (2013.01); *H01L 2924/35121* (2013.01)

(58) Field of Classification Search
CPC ............... H01L 24/08; H01L 23/49811; H01L 23/49827; H01L 23/498; H01L 24/96; H01L 23/295
See application file for complete search history.

(56) References Cited

U.S. PATENT DOCUMENTS 8,505,199 B2  8/2013  Kwon et al.
2007/0281464 A1* 12/2007  Hsu ........................ H05K 3/465
                                                        438/624

(Continued)

*Primary Examiner* — Marcos D. Pizarro
*Assistant Examiner* — Quinton A Brasfield
(74) *Attorney, Agent, or Firm* — Foley & Lardner LLP

(57) ABSTRACT

A semiconductor package includes a semiconductor substrate structure, a semiconductor die and an encapsulant. The semiconductor substrate structure includes a dielectric structure, a first patterned conductive layer, a first insulation layer and a conductive post. The first patterned conductive layer is embedded in the dielectric structure. The first insulation layer is disposed on the dielectric structure. The conductive post connects to the first patterned conductive layer and protrudes from the first insulation layer. The first insulation layer has a greater thickness at a position closer to the conductive post. The semiconductor die is electrically connected to the conductive post. The encapsulant covers the semiconductor die and at least a portion of the semiconductor substrate structure.

17 Claims, 19 Drawing Sheets

(51) Int. Cl.
 *H01L 21/48* (2006.01)
 *H01L 23/31* (2006.01)

(56) References Cited

U.S. PATENT DOCUMENTS

| | | | |
|---|---|---|---|
| 2009/0170242 A1* | 7/2009 | Lin | H01L 21/6835 438/107 |
| 2010/0221873 A1* | 9/2010 | Marimuthu | H01L 23/3121 438/124 |
| 2013/0107482 A1* | 5/2013 | Inagaki | H01G 4/224 361/763 |
| 2015/0115469 A1 | 4/2015 | Lee et al. | |
| 2016/0099223 A1* | 4/2016 | Hsieh | H01L 24/13 257/737 |

\* cited by examiner

SEMICONDUCTOR PACKAGE AND SEMICONDUCTOR MANUFACTURING PROCESS

BACKGROUND

1. Field of the Disclosure

The present disclosure relates to the field of semiconductor package and semiconductor manufacturing process, and, more particularly, to a semiconductor package including an embedded trace substrate (ETS), and a semiconductor manufacturing process for manufacturing the same.

2. Description of the Related Art

Along with the rapid development of electronic industries and the progress of semiconductor processing technologies, semiconductor chips are integrated with more electronic components to achieve improved electrical performance. Accordingly, the semiconductor chips are provided with more input/output (I/O) connections. To achieve semiconductor packages while using semiconductor chips with increasing numbers of I/O connections, sizes of the semiconductor chips and the semiconductor packages may correspondingly increase. Thus, the cost may correspondingly increase. Alternatively, to miniaturize semiconductor packages while using semiconductor chips with increasing numbers of I/O connections, a bonding pad density of semiconductor substrates used for carrying the semiconductor chips should correspondingly increase. Therefore, solder bridge and peeling between a conductive via and a bump pad are issues of concern. In addition, the formation of a through hole of a solder resist layer is difficult.

SUMMARY

In some embodiments, a semiconductor package includes a semiconductor substrate structure, a semiconductor die and an encapsulant. The semiconductor substrate structure includes a dielectric structure, a first patterned conductive layer, a first insulation layer and a conductive post. The first patterned conductive layer is embedded in the dielectric structure. The first insulation layer is disposed on the dielectric structure. The first insulation layer defines an opening exposing the first patterned conductive layer. The conductive post is disposed in the opening. The conductive post connects to the first patterned conductive layer and protrudes from the first insulation layer. The first insulation layer has a first thickness at a first position and a second thickness at a second position, the first position is closer to the conductive post than the second position, and the first thickness is greater than the second thickness. The semiconductor die is electrically connected to the conductive post. The encapsulant covers the semiconductor die and at least a portion of the semiconductor substrate structure.

In some embodiments, a semiconductor package includes a semiconductor substrate structure. The semiconductor substrate structure includes a dielectric structure, a first patterned conductive layer, a first insulation layer and a conductive post. The first patterned conductive layer is embedded in the dielectric structure. The first insulation layer is disposed on the dielectric structure. The first insulation layer defines an opening exposing the first patterned conductive layer. The conductive post is disposed in the opening. The conductive post connects to the first patterned conductive layer and protrudes from the first insulation layer. The first insulation layer includes a protrusion portion surrounding the conductive post. An inclination angle between a top surface of the protrusion portion and a sidewall of the conductive post is less than 90 degrees. In some embodiments, the semiconductor package also includes a semiconductor die and an encapsulant. The semiconductor die is electrically connected to the conductive post. The encapsulant covers the semiconductor die and at least a portion of the semiconductor substrate structure.

In some embodiments, a semiconductor manufacturing process includes: (a) providing a circuit structure, wherein the circuit structure includes a dielectric structure, a first patterned conductive layer and a plurality of conductive posts, the first patterned conductive layer is embedded in the dielectric structure, the conductive posts protrude from the first patterned conductive layer; (b) forming a first insulation layer on the dielectric structure to cover the conductive posts; and (c) thinning the first insulation layer so that the conductive posts protrude from the first insulation layer.

DETAILED DESCRIPTION

Figure 1:
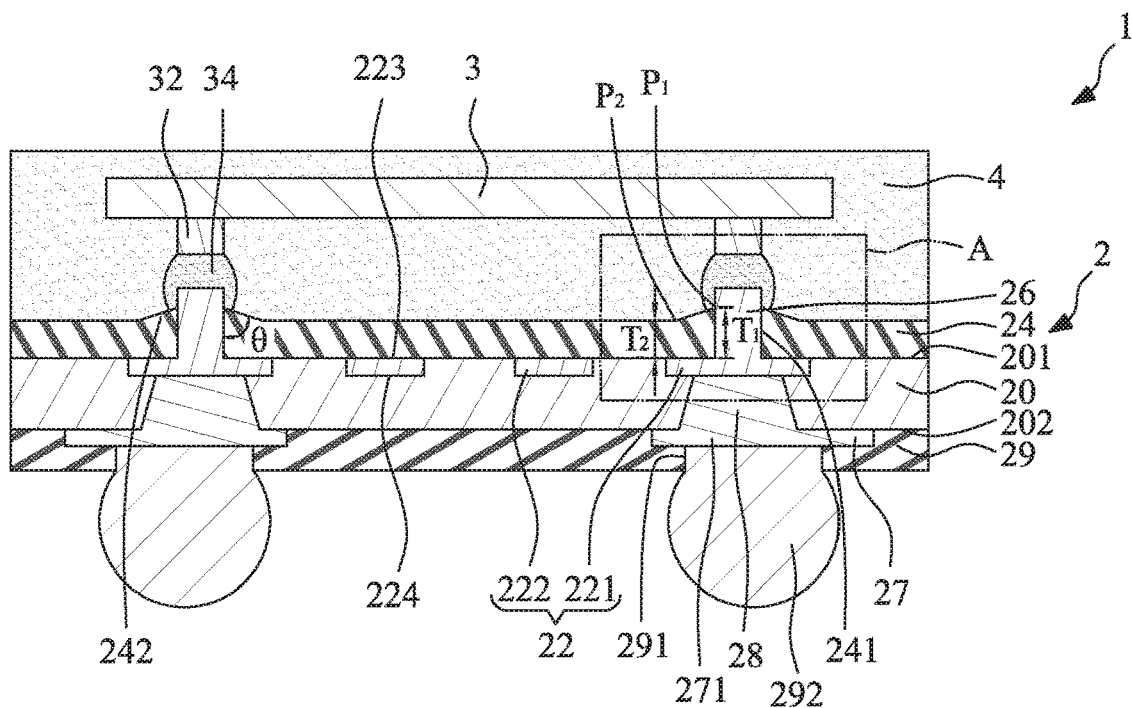
FIG. 1 illustrates a cross-sectional view of a semiconductor package according to some embodiments of the present disclosure.

A semiconductor substrate used for carrying semiconductor chips may be an embedded trace substrate (ETS), which may include at least one dielectric layer and two or more patterned conductive layers embedded therein. In a manufacturing process of a comparative ETS, a first patterned conductive layer (including bump pads and traces) is formed in a dielectric layer firstly. Then, a solder resist layer is formed on the dielectric layer to cover the first patterned conductive layer. Then, through holes are formed in the solder resist layer to expose the bump pads of the first patterned conductive layer. Then, a second patterned conductive layer is formed on the solder resist layer, and a plurality of conductive vias are formed in the through holes, so that the second patterned conductive layer is electrically connected to the first patterned conductive layer through the conductive vias.

The disadvantages of the comparative ETS are as follows. Firstly, a pitch between the bump pads is small (e.g., about 90 µm), and a tolerance for registration of the through holes of the solder resist layer is small (e.g., about 5 µm). Thus, there is a risk that the conductive via may contact a trace between the bump pads. Secondly, a diameter of the through holes of the solder resist layer is small (e.g., about 20 µm); thus, it may be difficult to form such through holes of the solder resist layer. Thirdly, the second patterned conductive layer and the conductive vias are formed on the solder resist layer, which results in poor adhesion therebetween. Fourthly, the first patterned conductive layer and the second patterned conductive layer are formed by two separate plating operations, which increases manufacturing time and cost, and the bonding between the conductive vias and the bump pads of the first patterned conductive layer may be poor. Fifthly, warpage of the comparative ETS may occur easily during the manufacturing process. Sixth, the solder resist layer is formed before the formation of the second patterned conductive layer and the conductive vias. Thus, during the following manufacturing process, the solder resist layer will be heated for a long time or for several cycles, which results in embrittlement and weakness of the solder resist layer.

To address the above concerns, the present disclosure provides an improved semiconductor package including an ETS and improved techniques for manufacturing the ETS. In some embodiments of the present disclosure, metal posts and bump pads of a first patterned conductive layer are formed by a single (or one-time) plating operation, and then a solder resist layer is formed on a dielectric layer. Then, a portion of the solder resist layer is removed so that the metal posts protrude from the solder resist layer. The metal posts and the bump pads of the first patterned conductive layer are formed integrally and concurrently, which results in easier metal post formation. Shapes of the metal posts are uniform; thus, a co-planarity of top surfaces of the metal posts is excellent. Further, there is no interface between the metal posts and the bump pads; thus, the bonding between the metal posts and the bump pads is excellent, which results in improved package reliability. In addition, there is no need to form small through holes of the solder resist layer. Therefore, there will be no registration issue of the through holes of the solder resist layer. Furthermore, a thickness of the solder resist layer may be controlled to a small value, which can reduce warpage of the ETS during the manufacturing process. In addition, the solder resist layer is formed after the formation of the metal posts. Thus, during the following manufacturing process, the solder resist layer will be heated for less time, so that a strength of the solder resist layer will not be adversely influenced.

FIG. 1 illustrates a cross-sectional view of a semiconductor package 1 according to some embodiments of the present disclosure. The semiconductor package 1 includes a semiconductor substrate structure 2, a semiconductor die 3 and an encapsulant 4. The semiconductor substrate structure 2 may be an ETS, and includes a dielectric structure 20, a first patterned conductive layer 22, a first, top insulation layer 24, a plurality of conductive posts 26, a second patterned conductive layer 27, a plurality of conductive vias 28, a second, bottom insulation layer 29 and a plurality of external connectors 292.

The dielectric structure 20 may be, or may include, for example, monocrystalline silicon, polycrystalline silicon, amorphous silicon, other suitable inorganic materials, or a combination thereof. The dielectric structure 20 may be, or may include, for another example, a sheet made from pre-impregnated composite fibers. The dielectric structure 20 has a first surface (e.g., a top surface) 201 and a second surface (e.g., a bottom surface) 202 opposite to the first surface 201.

The first patterned conductive layer 22 is embedded in the dielectric structure 20, and includes a plurality of bump pads 221, a plurality of traces 222, a first surface (e.g., a top surface) 223 and a second surface (e.g., a bottom surface) 224 opposite to the first surface 223. A width of each bump pad 221 may be about 30 µm, and a pitch between the bump pads 221 may be, for example, about 90 µm. A line width/line space (L/S) of the traces 222 may be about 12 µm/about 12 µm. A material of the first patterned conductive layer 22 may be, or may include, a conductive metal such as copper. The first patterned conductive layer 22 is disposed adjacent to the first surface 201 of the dielectric structure 20, and a portion (e.g., the first surface 223) of the first patterned conductive layer 22 is exposed from the first surface 201 of the dielectric structure 20. That is, the dielectric structure 20 does not cover the first surface 223 of the first patterned conductive layer 22. A distance between the second surface 224 of the first patterned conductive layer 22 and the second surface 202 of the dielectric structure 20 may be, for example, about 25 µm.

The first insulation layer 24 may be a solder resist layer such as a solder mask layer. The first insulation layer 24 is disposed on the first surface 201 of the dielectric structure 20 to cover at least a portion of the dielectric structure 20, and may contact the first patterned conductive layer 22 (including the bump pads 221 and the traces 222). The first insulation layer 24 defines a plurality of openings 241 corresponding to a first portion (e.g., the bump pads 221) of the first patterned conductive layer 22.

The conductive posts 26 are disposed in respective ones of the openings 241 of the first insulation layer 24. A material of the conductive posts 26 may be, or may include, a conductive metal such as copper. One end of each of the conductive posts 26 connects to the first portion (e.g., the bump pads 221) of the first patterned conductive layer 22, and the other end of each of the conductive posts 26 protrudes from the first insulation layer 24. In some embodiments, the conductive posts 26 and the first portion (e.g., the bump pads 221) of the first patterned conductive layer 22 are formed integrally and concurrently as a monolithic structure. In some embodiments, the openings 241 of the first insulation layer 24 are defined by the conductive posts 26. That is, the conductive posts 26 are formed before the formation of the first insulation layer 24, which will be described in a manufacturing process as below. In some embodiments, each conductive post 26 has a substantially consistent width. That is, a width of a portion of the conductive post 26 embedded in the first insulation layer 24 is substantially equal to a width of the other portion of the conductive post 26 protruding from the first insulation layer 24. A height of each conductive post 26 may be about 12 μm to 16 μm.

The second patterned conductive layer 27 is disposed on the second surface 202 of the dielectric structure 20 away from the first patterned conductive layer 22, and may include a plurality of ball pads 271. A material of the second patterned conductive layer 27 may be, or may include, a conductive metal such as copper. The conductive vias 28 are disposed in the dielectric structure 20 and electrically connect the first patterned conductive layer 22 and the second patterned conductive layer 27. In some embodiments, the conductive vias 28 and the second patterned conductive layer 27 are formed integrally and concurrently as a monolithic structure.

The bottom insulation layer 29 may be a solder resist layer such as a solder mask layer. The bottom insulation layer 29 is disposed on the second surface 202 of the dielectric structure 20 to cover at least a portion of the dielectric structure 20, and may contact the second patterned conductive layer 27 (including the ball pads 271). The bottom insulation layer 29 defines a plurality of openings 291 to expose a portion (e.g., the ball pads 271) of the second patterned conductive layer 27. The external connectors 292, such as solder balls, are disposed on the ball pads 271 of the second patterned conductive layer 27 in the openings 291 of the bottom insulation layer 29 for external connection.

The semiconductor die 3 is electrically connected to the conductive posts 26. In some embodiments, the semiconductor die 3 includes a plurality of pillars 32 and a plurality of connectors 34 such as solder caps. Each of the connectors 34 is disposed on a tip of a respective one of the pillars 32 and connects to a respective one of the conductive posts 26. As shown in FIG. 1, a portion of the connector 34 may extend to a sidewall of the conductive post 26 so that the soldering capability and reliability are enhanced.

The encapsulant 4, such as a molding compound, covers the semiconductor die 3 and a portion (e.g., the first insulation layer 24) of the semiconductor substrate structure 2. The encapsulant 4 extends to a space between the semiconductor die 3 and the semiconductor substrate structure 2 so as to protect the conductive posts 26, the pillars 32 and the connectors 34.

Figure 2:
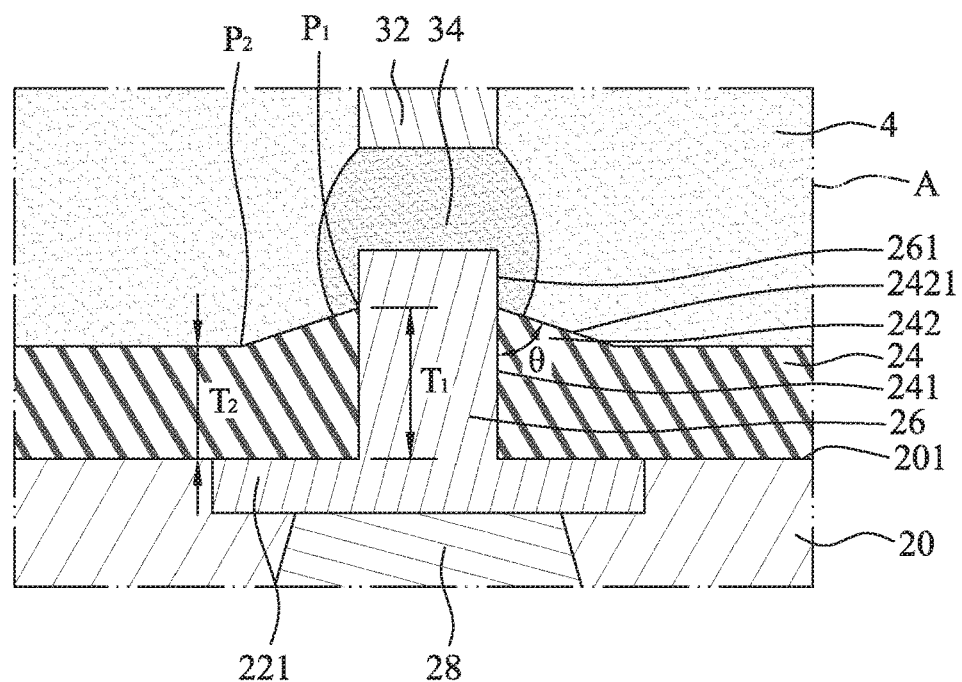
FIG. 2 illustrates an enlarged view of a region "A" of the semiconductor package shown in FIG. 1 according to some embodiments of the present disclosure.

FIG. 2 illustrates an enlarged view of a region "A" of the semiconductor package 1 shown in FIG. 1 according to some embodiments of the present disclosure. The first insulation layer 24 has a first thickness T1 at a first position P1 and a second thickness T2 at a second position P2. The first position P1 is closer to the conductive post 26 than the second position P2, and the first thickness T1 is greater than the second thickness T2, such as where T1 is greater than 1.1 times T2, or about 1.2 times or greater, or about 1.3 times or greater. Thus, the first insulation layer 24 has a plurality of protrusion portions 242, and each of the protrusion portions 242 surrounds a respective one of the conductive posts 26. A thickness of the protrusion portion 242 decreases with increasing distance from the conductive post 26. As shown in FIG. 2, a top surface 2421 of the protrusion portion 242 from a cross-sectional view is a substantially flat surface. An inclination angle θ between the top surface 2421 of the protrusion portion 242 and a sidewall 261 of the conductive post 26 is less than 90 degrees, such as about 60 degrees or less, or about 45 degrees or less. The protrusion portions 242 may be formed as follows. The first insulation layer 24 is thinned by, for example, etching or a desmear process, and portions of the first insulation layer 24 surrounding the conductive posts 26 are removed to a lesser extent and will remain after the thinning process.

As shown in the embodiments illustrated in FIGS. 1 and 2, the conductive posts 26 and the bump pads 221 of the first patterned conductive layer 22 are formed by a single (or one-time) plating operation, that is, the conductive posts 26 and the bump pads 221 of the first patterned conductive layer 22 are formed integrally and concurrently, which results in easier metal post formation. In addition, shapes of the conductive posts 26 are uniform; thus, a co-planarity of top surfaces of the metal posts 26 is excellent, which facilitates the bonding between the semiconductor die 3 and the conductive posts 26. Further, there is no interface between the conductive posts 26 and the bump pads 221; thus, the bonding between the conductive posts 26 and the bump pads 221 is excellent (and a risk of peeling between the conductive posts 26 and the bump pads 221 is low), which results in improved package reliability. In addition, the formation of small through holes of the first insulation layer 24 may be omitted. Therefore, there will be no registration issue of the through holes of the first insulation layer 24. Furthermore, the thickness of the first insulation layer 24 may be adjusted to a small value by thinning (e.g., etching), which can control warpage of the semiconductor substrate structure 2 during the manufacturing process.

Figure 3:
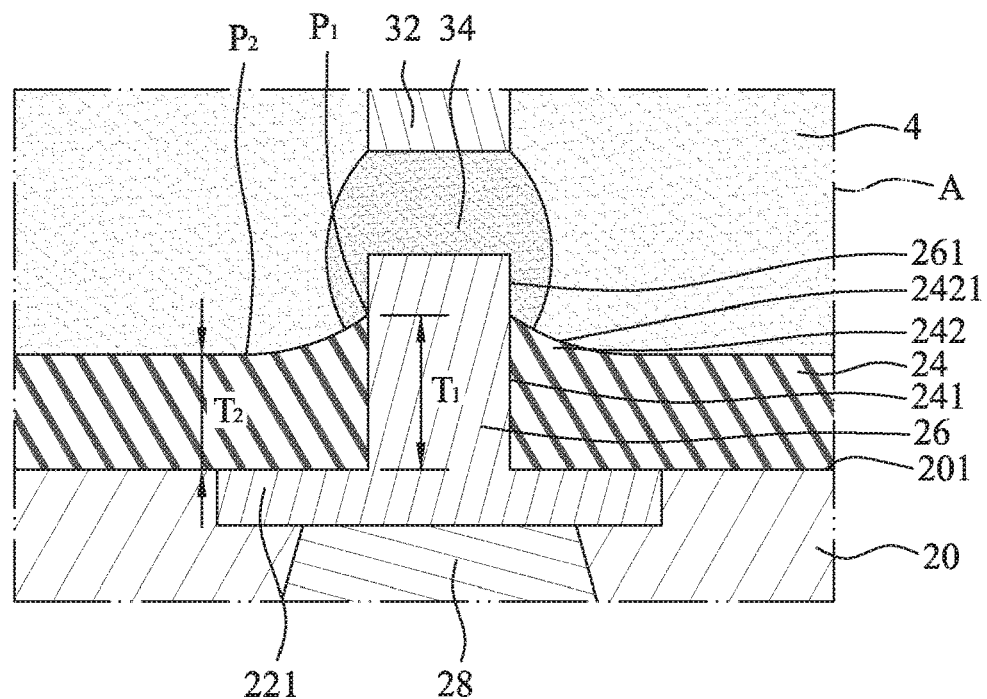
FIG. 3 illustrates an enlarged view of a region of a semiconductor package according to some embodiments of the present disclosure.

FIG. 3 illustrates an enlarged view of a region of a semiconductor package according to some embodiments of the present disclosure. The structure of FIG. 3 is similar in certain aspects to the structure as shown in FIG. 2, with differences including a different structure of the first insulation layer 24 as compared to the first insulation layer 24 of FIG. 2. As shown in FIG. 3, the top surface 2421 of the protrusion portion 242 of the first insulation layer 24 from a cross-sectional view is a curved surface.

Figure 4:
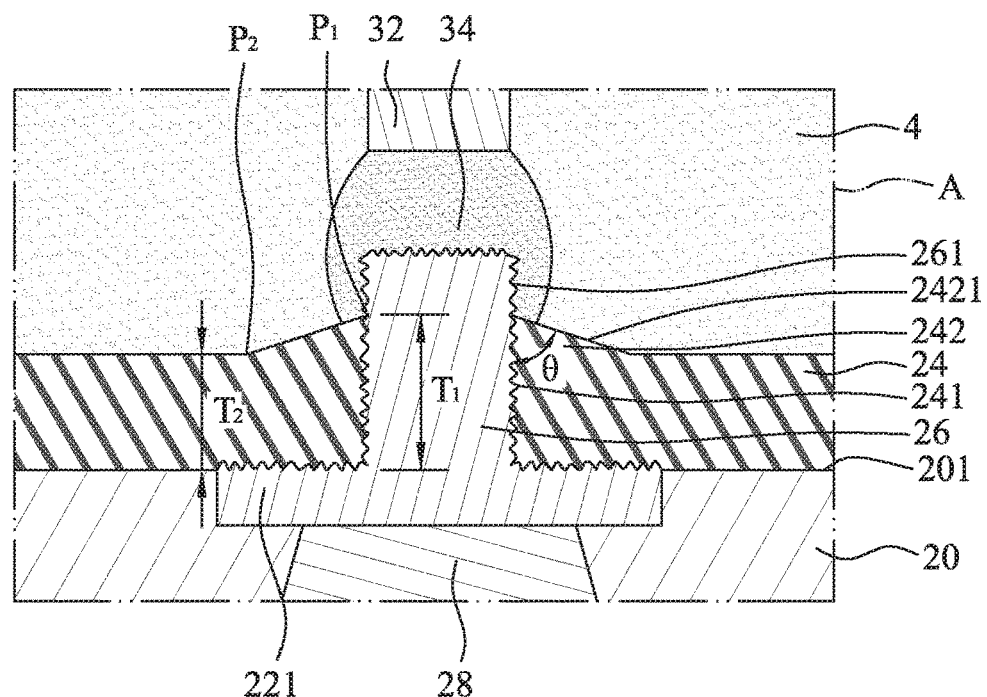
FIG. 4 illustrates an enlarged view of a region of a semiconductor package according to some embodiments of the present disclosure.

FIG. 4 illustrates an enlarged view of a region of a semiconductor package according to some embodiments of the present disclosure. The structure of FIG. 4 is similar in certain aspects to the structure as shown in FIG. 2, with differences including a different structure of the conductive posts 26 and bump pads 221 as compared to the conductive posts 26 and the bump pads 221 of FIG. 2. As shown in FIG. 4, a peripheral surface (e.g., of the sidewall 261) and a top surface of the conductive post 26 and a top surface of the bump pad 221 are rough surfaces. For example, the surface roughness (Ra or arithmetic average of a surface profile) of the peripheral surface and top surface of the conductive post 26 and the top surface of the bump pad 221 may be about 3 μm or greater, about 5 μm or greater, or about 10 μm or greater. The rough surfaces of the conductive post 26 and the bump pad 221 can enhance an adhesion between the first insulation layer 24 and the conductive post 26 and the bump pads 221, so as to increase reliability.

Figure 5:
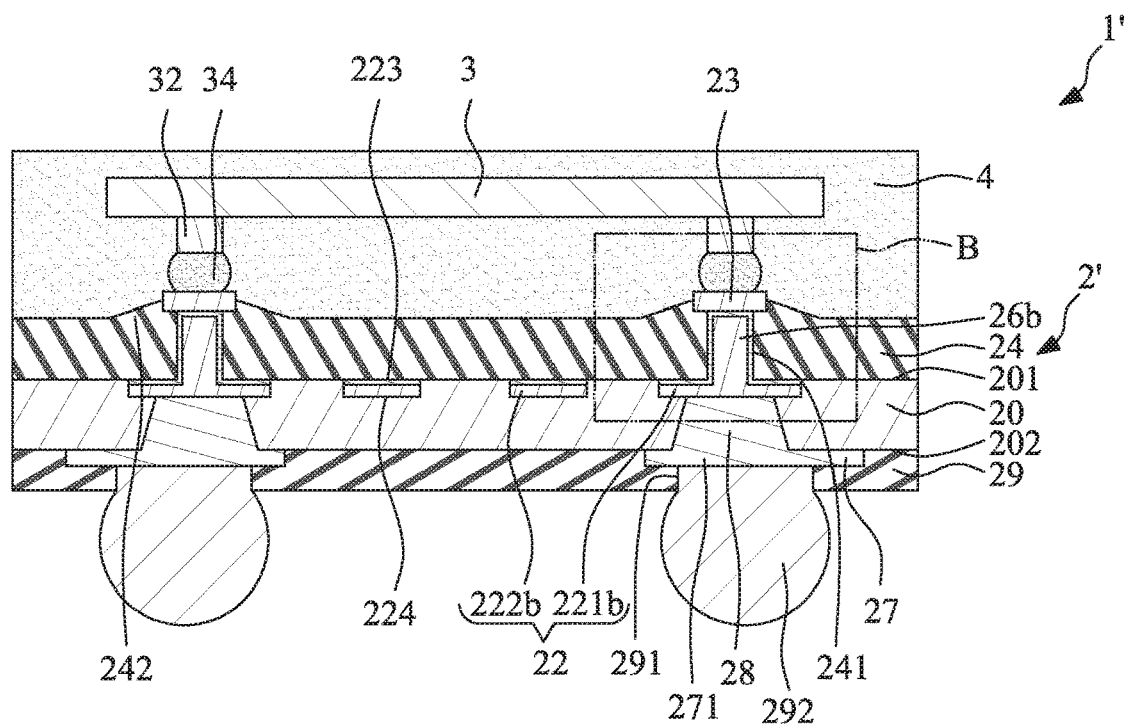
FIG. 5 illustrates a cross-sectional view of a semiconductor package according to some embodiments of the present disclosure.
Figure 5A:
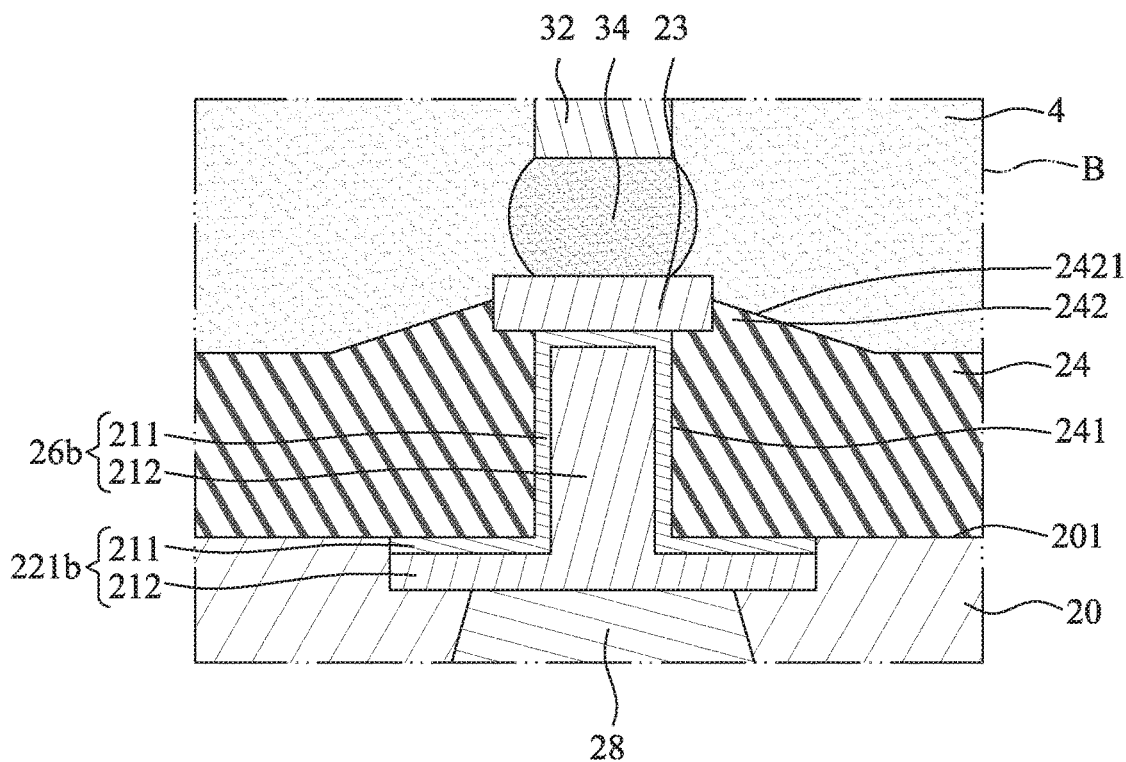
FIG. 5A illustrates an enlarged view of a region "B" of the semiconductor package of FIG. 5 according to some embodiments of the present disclosure.

FIG. 5 illustrates a cross-sectional view of a semiconductor package 1' according to some embodiments of the present disclosure. FIG. 5A illustrates an enlarged view of a region "B" of a semiconductor package of FIG. 5. The semiconductor package 1' of FIG. 5 is similar in certain aspects to the semiconductor package 1 as shown in FIG. 1, with differences including a different structure of a semiconductor substrate structure 2' as compared to the semiconductor substrate structure 2 of FIG. 1. As shown in FIGS. 5 and 5A, the semiconductor substrate structure 2' includes a plurality of conductive posts 26b, a plurality of bump pads 221b, and a plurality of bonding pads 23. Each conductive post 26b includes a seed layer 211 and a conductive metal portion 212 in the opening 241 of the first insulation layer 24. Each bump pad 221b includes the seed layer 211 and the conductive metal portion 212 embedded in the dielectric structure 20. Each bonding pad 23 is disposed on the respective conductive post 26b. A width of the bonding pad 23 is greater than a width of the conductive post 26b, so as to increase a bonding area between the connector 34 and the bonding pad 23 and, thereby, increase reliability. It is noted that the protrusion portion 242 of the first insulation layer 24 may contact a peripheral surface of the bonding pad 23. It is noted that the seed layer 211 may be omitted.

Figure 6:
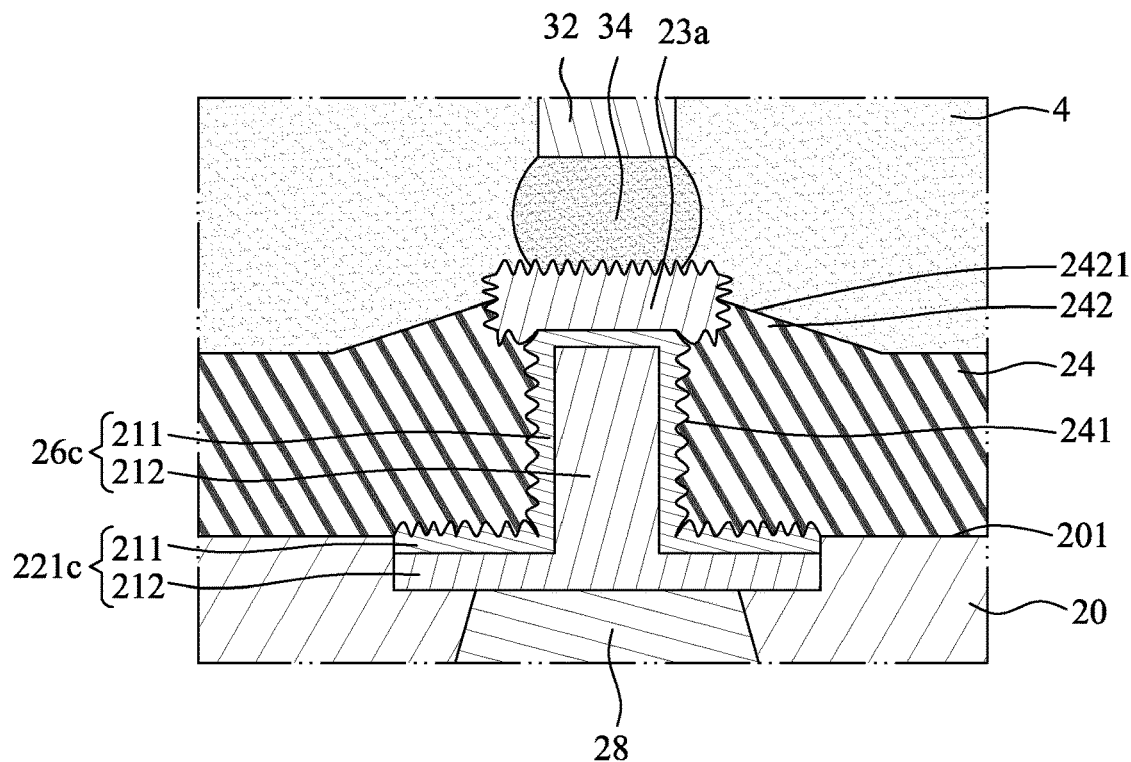
FIG. 6 illustrates an enlarged view of a region of a semiconductor package according to some embodiments of the present disclosure.

FIG. 6 illustrates an enlarged view of a region of a semiconductor package according to some embodiments of the present disclosure. The structure of FIG. 6 is similar in certain aspects to the structure as shown in FIG. 5A, with differences including a different structure of conductive posts 26c, bump pads 221c and bonding pads 23a as compared to the conductive posts 26b, the bump pads 221b and bonding pads 23 of FIG. 5A. As shown in FIG. 6, a peripheral surface the conductive post 26c, a top surface of the bump pad 221c, a peripheral surface and a top surface of the bonding pad 23a are rough surfaces. For example, a surface roughness (Ra) of the peripheral surface the conductive post 26c, the top surface of the bump pad 221c, and the peripheral surface and the top surface of the bonding pad 23a may be about 3 μm or greater, about 5 μm or greater, or about 10 μm or greater. The rough surfaces of the conductive post 26c, the bump pad 221c, and the bonding pad 23a can enhance an adhesion between the first insulation layer 24 and the conductive post 26c, the bump pad 221c and the bonding pad 23a, so as to increase reliability.

Figure 7:
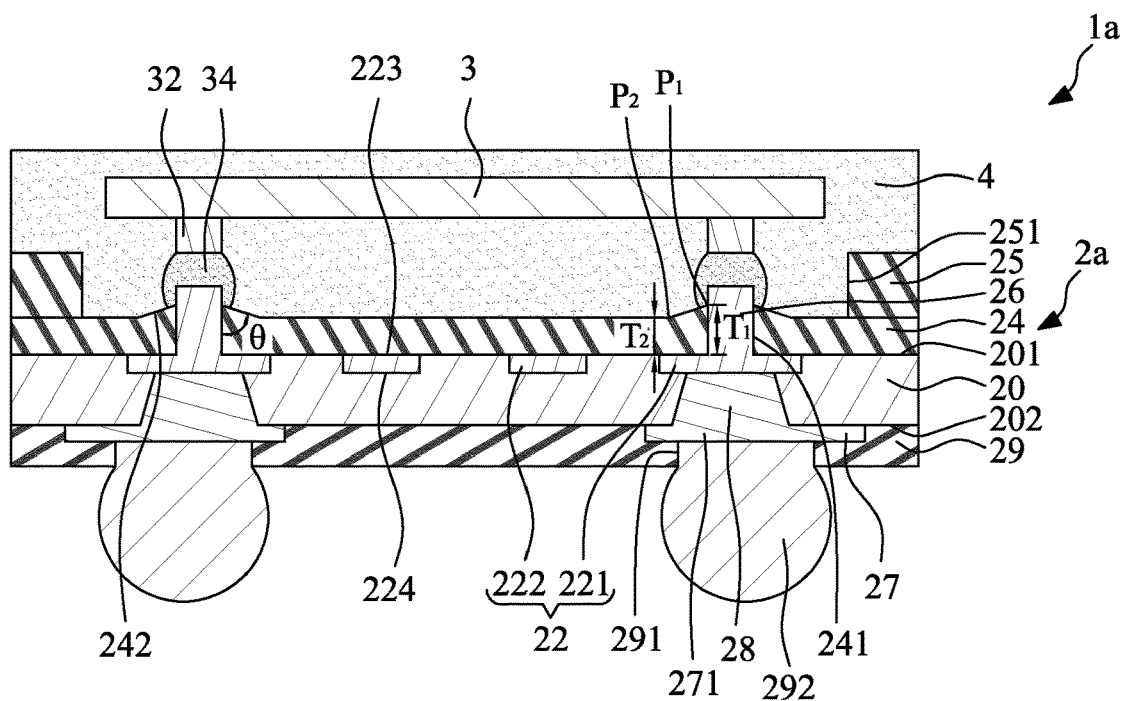
FIG. 7 illustrates a cross-sectional view of a semiconductor package according to some embodiments of the present disclosure.

FIG. 7 illustrates a cross-sectional view of a semiconductor package 1a according to some embodiments of the present disclosure. The semiconductor package 1a of FIG. 7 is similar in certain aspects to the semiconductor package 1 as shown in FIG. 1, with differences including a different structure of a semiconductor substrate structure 2a as compared to the semiconductor substrate structure 2 of FIG. 1. As shown in FIG. 7, the semiconductor substrate structure 2a further includes a third insulation layer 25 disposed on the first insulation layer 24. The third insulation layer 25 may be a solder resist layer such as a solder mask layer, which may be the same as or different from the first insulation layer 24. The third insulation layer 25 defines at least one accommodating opening 251 to accommodate at least two conductive posts 26. A top surface of the third insulation layer 25 is higher than top surfaces of the conductive posts 26, so as to prevent the conductive posts 26 from damage. Further, warpage of the semiconductor substrate structure 2a may be controlled by adjusting a thickness of the third insulation layer 25.

Figure 8:
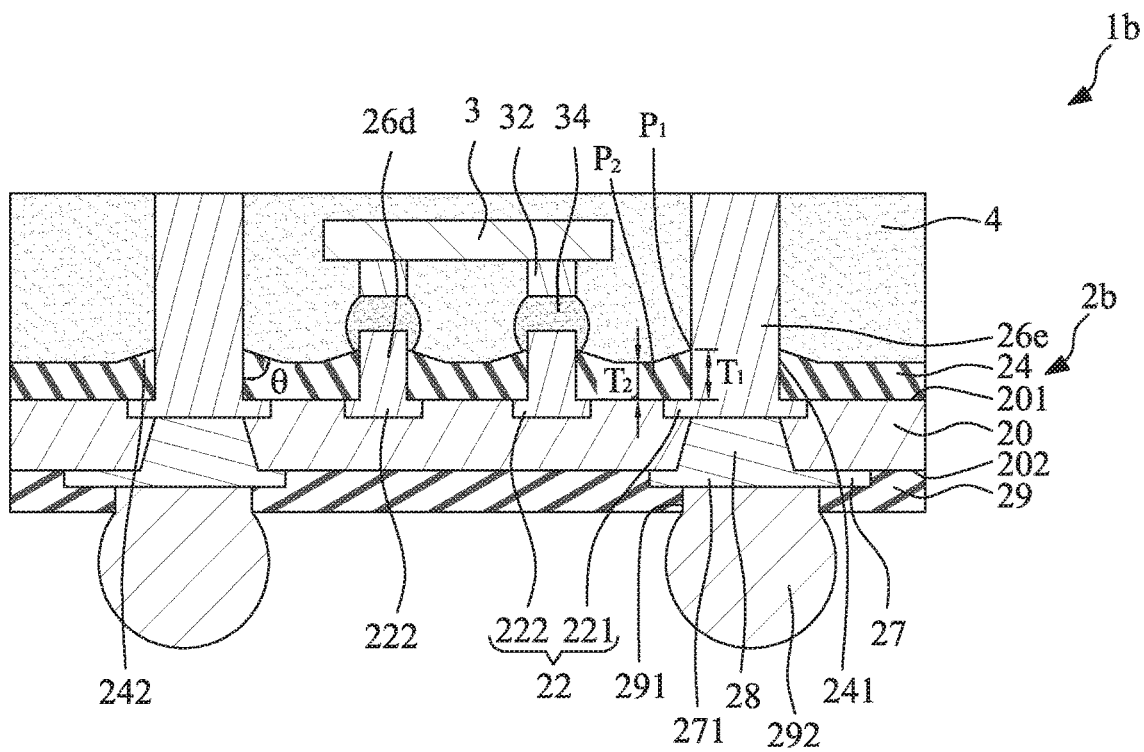
FIG. 8 illustrates a cross-sectional view of a semiconductor package according to some embodiments of the present disclosure.

FIG. 8 illustrates a cross-sectional view of a semiconductor package 1b according to some embodiments of the present disclosure. The semiconductor package 1b of FIG. 8 is similar in certain aspects to the semiconductor package 1 as shown in FIG. 1, with differences including a different structure of a semiconductor substrate structure 2b as compared to the semiconductor substrate structure 2 of FIG. 1. As shown in FIG. 8, the semiconductor substrate structure 2b further includes conductive posts 26d disposed on a portion of the traces 222 of the first patterned conductive layer 22, and conductive posts 26e disposed on the bump pads 221 of the first patterned conductive layer 22. One end of each of the conductive posts 26d connects to the traces 222 of the first patterned conductive layer 22, and the other end of each of the conductive posts 26d protrudes from the first insulation layer 24. The protrusion portions 242 of the first insulation layer 24 may surround the conductive posts 26d, and may surround the conductive posts 26e. In some embodiments, the conductive posts 26e may extend upward and beyond the semiconductor die 3 so that top ends or surfaces of the conductive posts 26e are exposed from a top surface of the encapsulant 4.

In some embodiments, the conductive posts 26d, the traces 222, the conductive posts 26e and the bump pads 221 are formed integrally and concurrently. A height of the conductive posts 26d may be substantially equal to or may be less than a height of the conductive post 26e. It is noted that additional bonding pads (not shown) may be formed on top of the conductive posts 26d.

Figure 9:
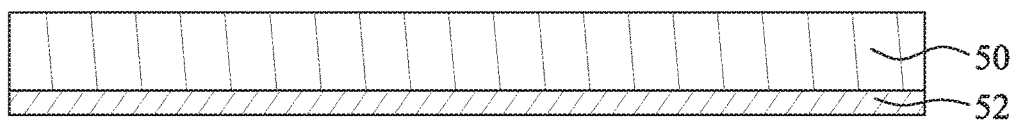
FIG. 9, FIG. 10, FIG. 11, FIG. 12, FIG. 13, FIG. 14, FIG. 15, FIG. 16, FIG. 17, FIG. 18 and FIG. 19 illustrate a semiconductor manufacturing process according to some embodiments of the present disclosure.

FIGS. 9 to 19 illustrate a semiconductor manufacturing process according to some embodiments of the present disclosure. Referring to FIG. 9, a carrier 50 and a metal layer 52 (e.g., a metal foil) are provided. The metal layer 52 is disposed on one surface of the carrier 50. However, there may be another metal layer (not shown) disposed on another surface of the carrier 50; thus, the manufacturing process can be performed on two sides of the carrier 50. FIGS. 9 to 19 describe the manufacturing process performed on one side of the carrier 50. It is noted that the manufacturing process can be performed on the other side of the carrier 50 in a similar way.

Figure 10:
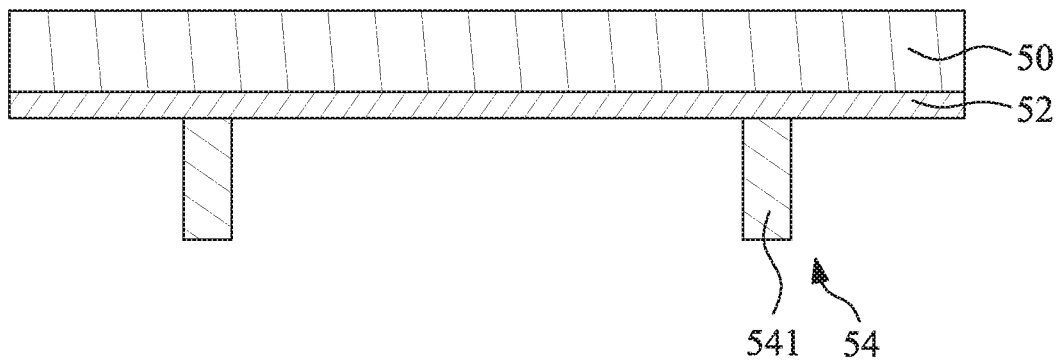

Referring to FIG. 10, a photoresist layer 54 is formed on the metal layer 52. The photoresist layer 54 may be a dry film. Then, the photoresist layer 54 is patterned by, for example, a photolithography process (including exposure and development) to form a plurality of remaining portions 541.

Figure 11:
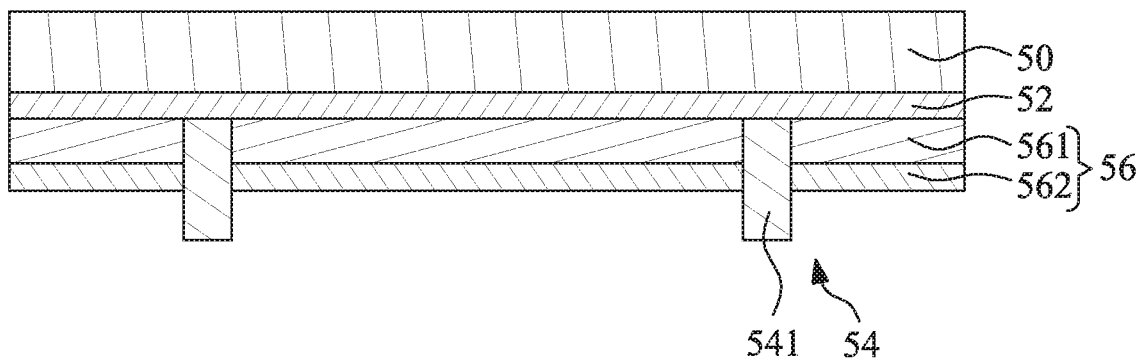

Referring to FIG. 11, at least one intermediate metal layer 56 (e.g., a nickel layer 561 and a copper layer 562) is formed on portions of the metal layer 52 that are not covered by the remaining portions 541 of the photoresist layer 54. In some embodiments, the intermediate metal layer 56 includes the nickel layer 561 formed on the metal layer 52 by electrolytic plating and the copper layer 562 formed on the nickel layer 561 by plating.

Figure 12:
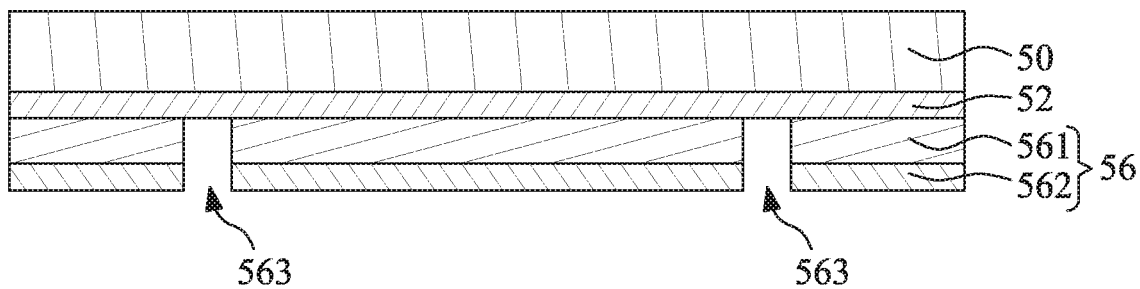

Referring to FIG. 12, the remaining portions 541 of the photoresist layer 54 are removed by, for example, stripping, to leave the intermediate metal layer 56 (including the nickel layer 561 and the copper layer 562) on the metal layer 52. A thickness of the intermediate metal layer 56 may be about 12 μm to about 16 μm. The intermediate layer 56 defines a plurality of through holes 563 to expose a portion of the metal layer 52. It is noted that the through holes 563 of the intermediate layer 56 correspond to the conductive posts 26 of FIG. 1.

Figure 13:
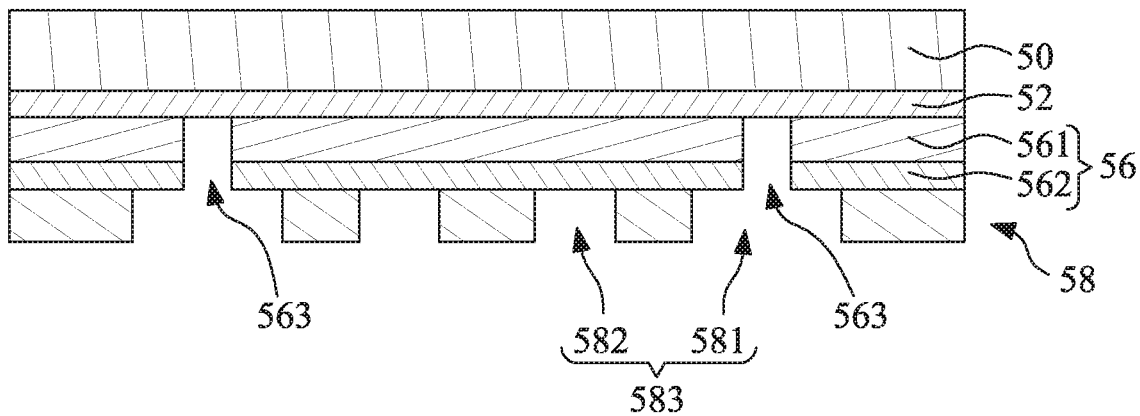

Referring to FIG. 13, a photoresist layer 58 is formed on the intermediate layer 56. The photoresist layer 58 may be a dry film. The photoresist layer 58 defines a first pattern 583 including a plurality of first openings 581 and a plurality of second openings 582. The first openings 581 are communicated and aligned with the through holes 563 of the intermediate layer 56 to expose the through holes 563. The second openings 582 expose a portion of the intermediate layer 56. It is noted that the first openings 581 and the second openings 582 correspond to the bump pads 221 and the traces 222 of FIG. 1, respectively.

Figure 14:
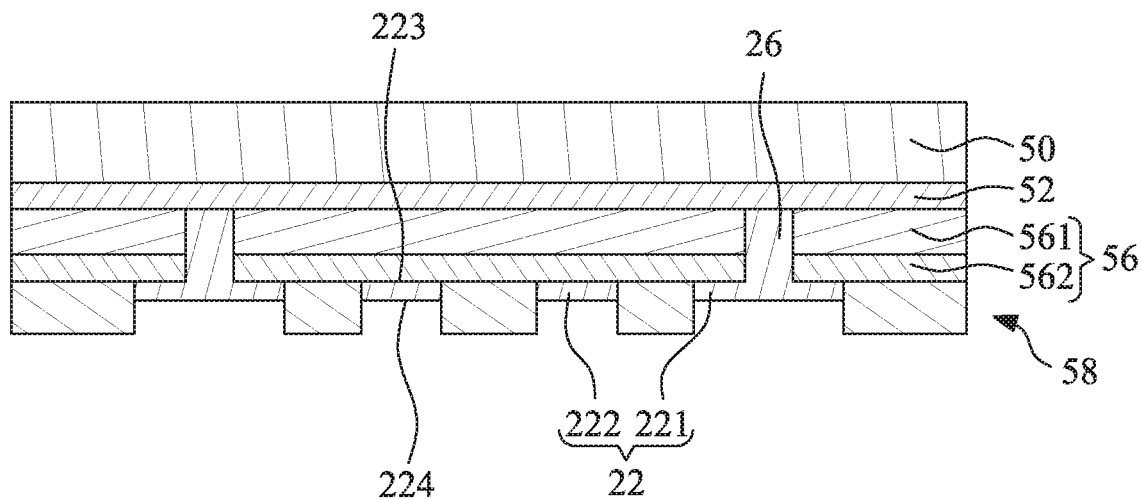

Referring to FIG. 14, a metal (e.g., copper) is deposited or otherwise disposed on the first pattern 583 of the photoresist layer 58 and in the through holes 563 of the intermediate layer 56. The metal disposed in the first pattern 583 of the photoresist layer 58 forms the first patterned conductive layer 22 including the bump pads 221 and the traces 222. The metal disposed in the through holes 563 of the intermediate layer 56 forms the conductive posts 26. Therefore, the conductive posts 26 and the bump pads 221 are formed by a single (or one-time) plating operation, that is, the conductive posts 26 and the bump pads 221 are formed integrally and concurrently, which results in easier metal post formation.

Figure 15:
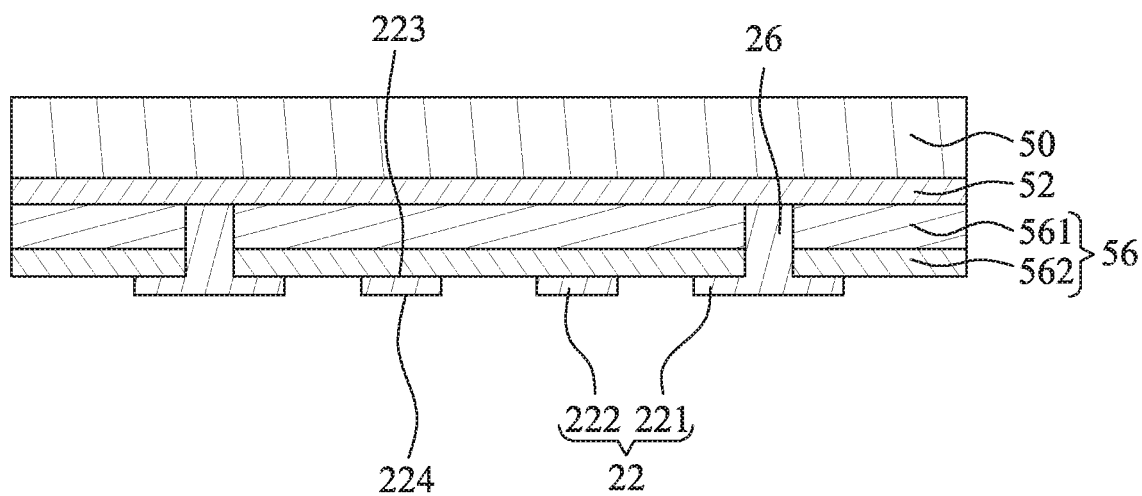

Referring to FIG. 15, the photoresist layer 58 is removed by, for example, stripping.

Figure 16:
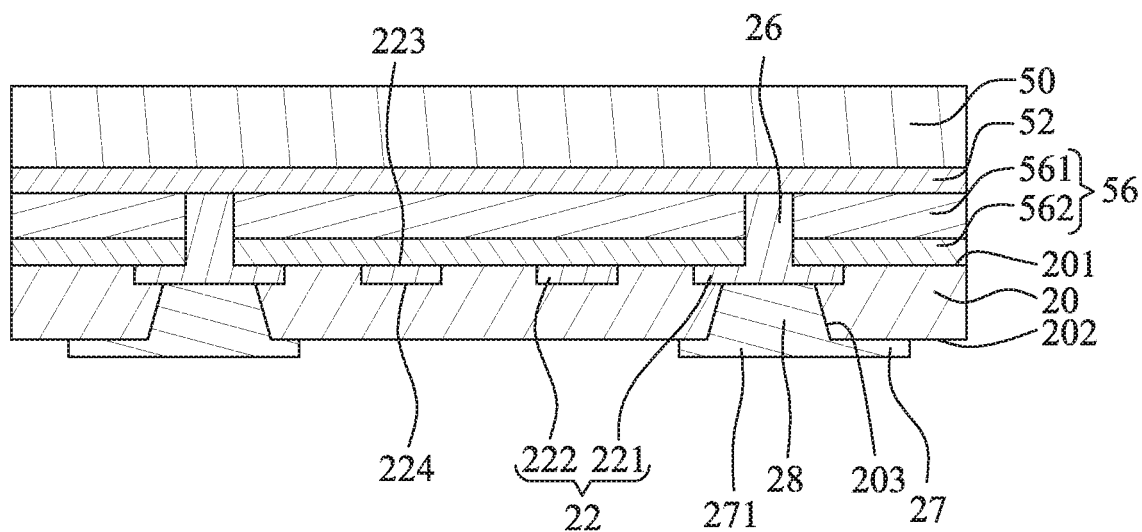

Referring to FIG. 16, the dielectric structure 20 is formed on the intermediate layer 56 to cover the first patterned conductive layer 22. The dielectric structure 20 has the first surface 201 and the second surface 202 opposite to the first surface 201. Then, a plurality of openings 203 are formed in the dielectric structure 20 from the second surface 202 to expose the bump pads 221. Then, a metal, such as copper, is deposited or otherwise disposed (e.g., plated) in the openings 203 and on the dielectric structure 20 so as to form the conductive vias 28 and the second patterned conductive layer 27. The second patterned conductive layer 27 is disposed on the second surface 202 of the dielectric structure 20 away from the first patterned conductive layer 22, and may include the plurality of ball pads 271. The conductive vias 28 are disposed in the openings 203 of the dielectric structure 20 and electrically connect the first patterned conductive layer 22 and the second patterned conductive layer 27. In some embodiments, the conductive vias 28 and the second patterned conductive layer 27 are formed integrally and concurrently.

Figure 17:
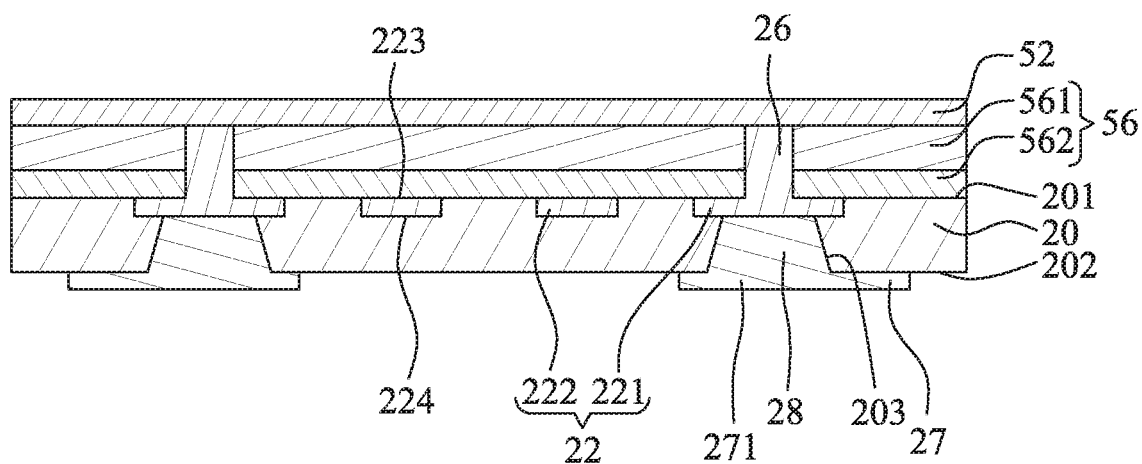

Referring to FIG. 17, the carrier 50 is removed.

Figure 18:
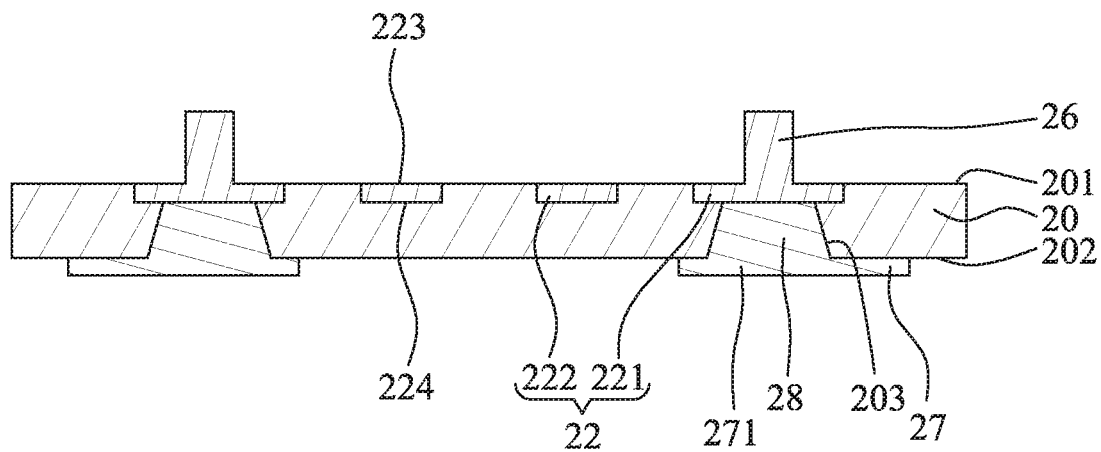

Referring to FIG. 18, the metal layer 52 and the intermediate layer 56 are removed by, for example, etching. Meanwhile, a circuit structure is obtained, wherein the circuit structure includes the dielectric structure 20, the first patterned conductive layer 22 and the conductive posts 26. The first patterned conductive layer 22 is embedded in the dielectric structure 20, and the conductive posts 26 protrude from a portion (e.g., the bump pads 221) of the first patterned conductive layer 22. In some embodiments, a pretreatment process (e.g., etching) may be conducted to roughen peripheral surfaces and top surfaces of the conductive posts 26 and top surfaces of the bump pads 221 as shown in FIG. 4.

Figure 19:
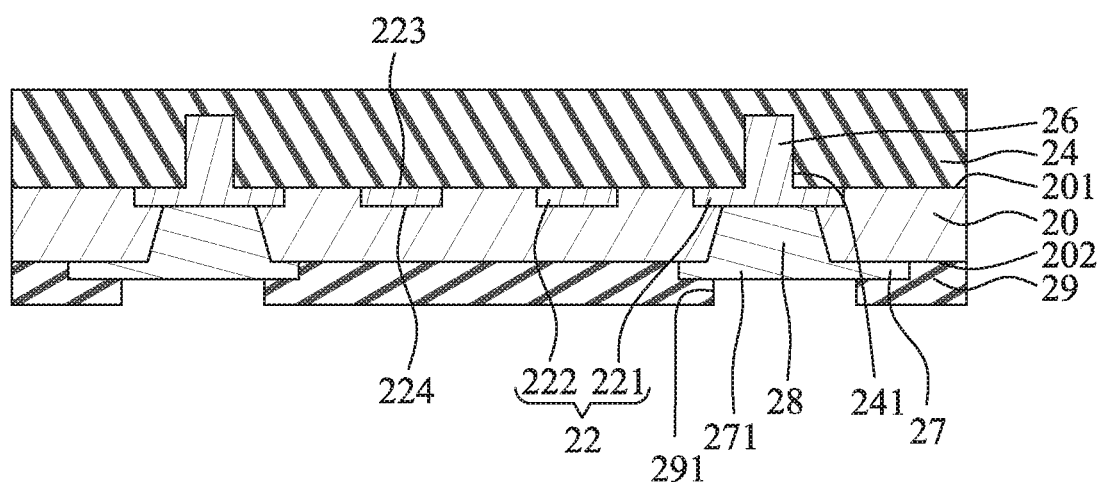

Referring to FIG. 19, the bottom insulation layer 29 is formed on the second surface 202 of the dielectric structure 20 of the circuit structure to cover the second patterned conductive layer 27 and the dielectric structure 20. Then, the openings 291 are formed in the bottom insulation layer 29 to expose a portion (e.g., the ball pads 271) of the second patterned conductive layer 27. Then, the first insulation layer 24 is formed on the first surface 201 of the dielectric structure 20 of the circuit structure to cover the first surface 201 of the dielectric structure 20 and the conductive posts 26. The openings 241 of the first insulation layer 24 are defined by the conductive posts 26.

Then, the first insulation layer 24 is thinned from its top surface so that the conductive posts 26 protrude from the first insulation layer 24 by, for example, etching or a desmear process. Meanwhile, the semiconductor substrate structure 2 of FIG. 1 is obtained.

In some embodiments, the manufacturing process may further include the following stages. A semiconductor die 3 is electrically connected to the conductive posts 26. Then, an encapsulant 4 is formed to cover the semiconductor die 3 and a portion (e.g., the first insulation layer 24) of the semiconductor substrate structure 2. Then, a plurality of external connectors 292 are attached to the exposed portion (e.g., the ball pads 271) of the second patterned conductive layer 27 in the openings 291 of the bottom insulation layer 29. Meanwhile, the semiconductor package 1 as shown in FIG. 1 is obtained.

In some embodiments, the manufacturing process may further include the following stages. The third insulation layer 25 is formed on the first insulation layer 24, wherein the third insulation layer 25 defines at least one accommodating opening 251 to expose at least two conductive posts 26. Meanwhile, the semiconductor package 1a as shown in FIG. 7 is obtained.

Figure 20:
FIG. 20, FIG. 21, FIG. 22, FIG. 23, FIG. 24, FIG. 25, FIG. 26 and FIG. 27 illustrate a semiconductor manufacturing process according to some embodiments of the present disclosure.

FIGS. 20 to 27 illustrate a semiconductor manufacturing process according to some embodiments of the present disclosure. Referring to FIG. 20, the carrier 50 and the metal layer 52 are provided.

Figure 21:
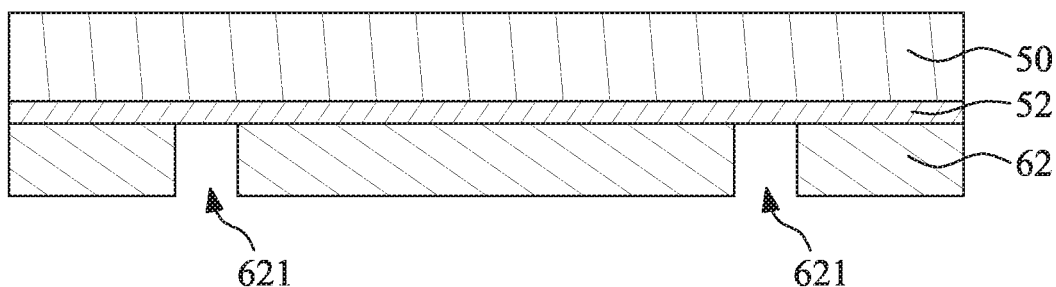

Referring to FIG. 21, a photoresist layer 62 is formed on the first metal layer 52. The photoresist layer 62 may be a dry film. Then, the photoresist layer 62 is patterned by, for example, a photolithography process (including exposure and development) to form a plurality of through holes 621 to expose a portion of the metal layer 52. The photoresist layer 62 is also an intermediate layer. It is noted that the through holes 621 may be formed by laser drilling.

Figure 22:
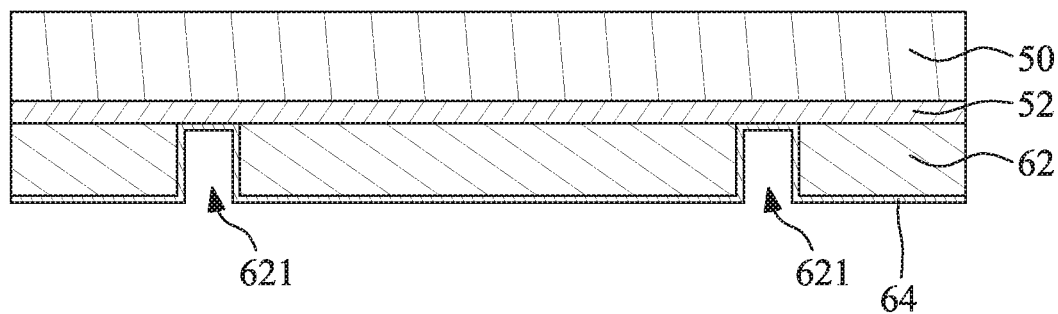

Referring to FIG. 22, a seed layer 64 is formed on the intermediate photoresist layer 62 (e.g., the intermediate layer) and in the through holes 621.

Figure 23:
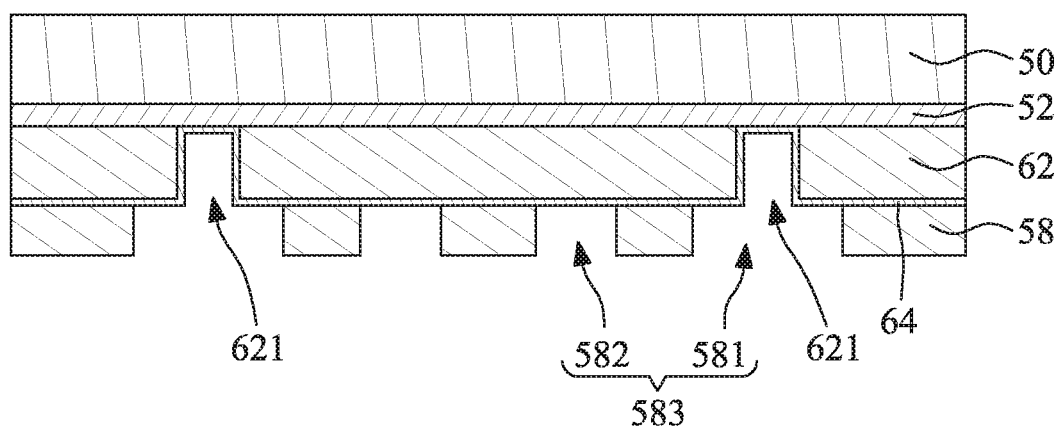

Referring to FIG. 23, the photoresist layer 58 is formed on the seed layer 64 on the intermediate photoresist layer 62 (e.g., the intermediate layer). The photoresist layer 58 defines the first pattern 583 including the first openings 581 and the second openings 582. The first openings 581 are communicated and aligned with the through holes 621 of the intermediate photoresist layer 62 to expose the through holes 621. The second openings 582 expose a portion of the seed layer 64 on the intermediate photoresist layer 62. It is noted that the first openings 581 and the second openings 582 correspond to the bump pads 221 and the traces 222 of FIG. 1, respectively.

Figure 24:
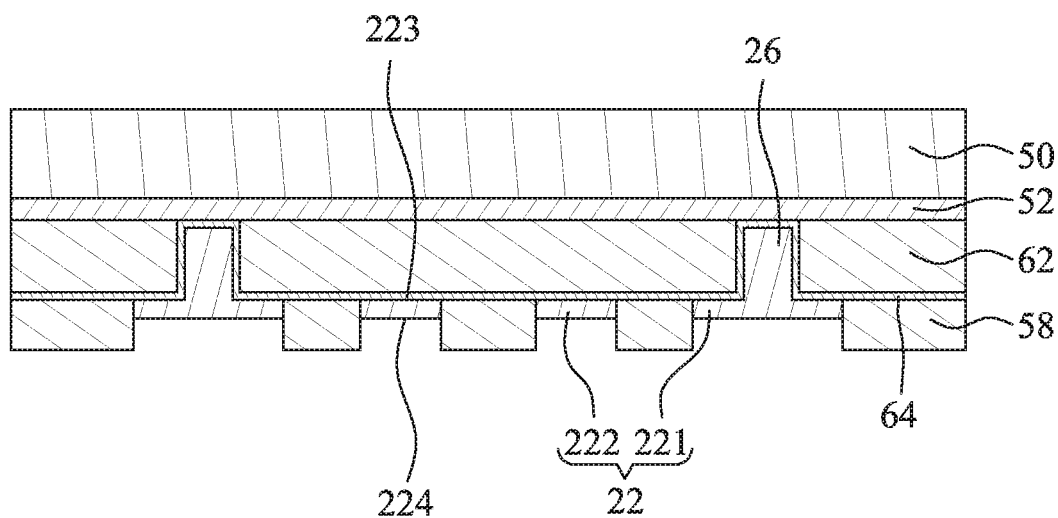

Referring to FIG. 24, a metal (e.g., copper) is deposited or otherwise disposed on the seed layer 64 in the first pattern 583 of the photoresist layer 58 and on the seed layer 64 in the through holes 621 of the intermediate photoresist layer 62. The metal disposed in the first pattern 583 of the photoresist layer 58 forms the first patterned conductive layer 22 including the bump pads 221 and the traces 222. The metal disposed in the through holes 621 of the intermediate photoresist layer 62 forms the conductive posts 26.

Figure 25:
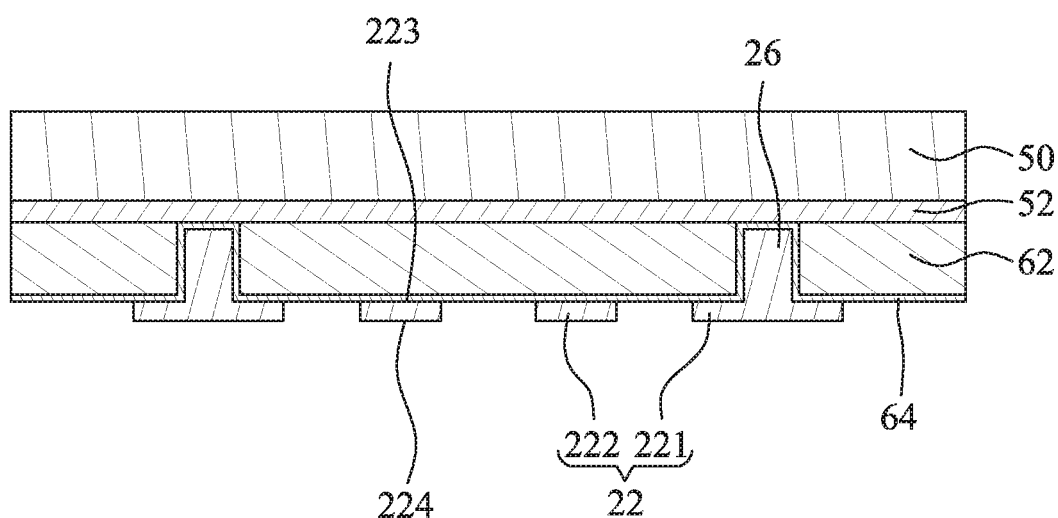

Referring to FIG. 25, the photoresist layer 58 is removed by, for example, stripping.

Figure 26:
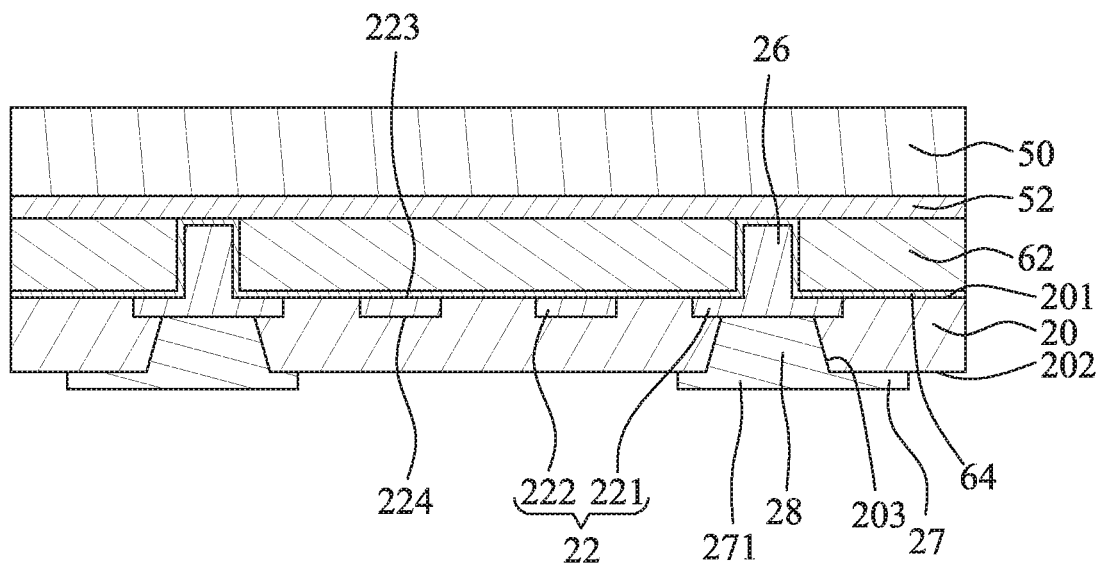

Referring to FIG. 26, the dielectric structure 20 is formed on the intermediate photoresist layer 62 to cover the first patterned conductive layer 22. Then, the conductive vias 28 are formed in the openings 203 of the dielectric structure 20, and the second patterned conductive layer 27 is formed on the second surface 202 of the dielectric structure 20.

Figure 27:
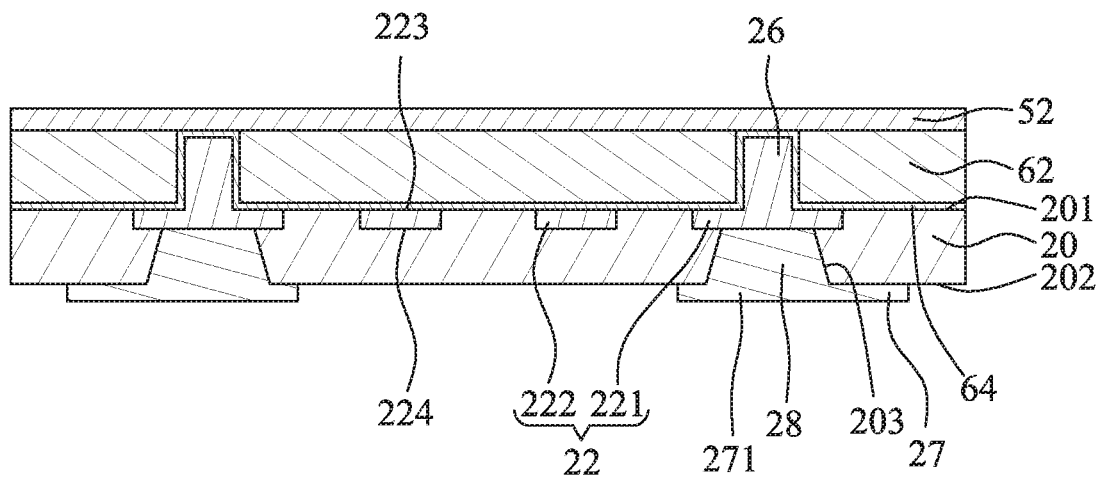

Referring to FIG. 27, the carrier 50 is removed.

Then, the metal layer 52, the intermediate photoresist layer 62 and the seed layer 64 are removed by, for example, etching to result in the circuit structure as shown in FIG. 18.

Then, the following stage is similar to the stage illustrated in FIG. 19 so as to obtain the semiconductor substrate structure 2 of FIG. 1.

Figure 28:
FIG. 28, FIG. 29, FIG. 30, FIG. 31, FIG. 32, FIG. 33, FIG. 34, FIG. 35, FIG. 36 and FIG. 37 illustrate a semiconductor manufacturing process according to some embodiments of the present disclosure.

FIGS. 28 to 37 illustrate a semiconductor manufacturing process according to some embodiments of the present disclosure. Referring to FIG. 28, the carrier 50 and the metal layer 52 are provided.

Figure 29:
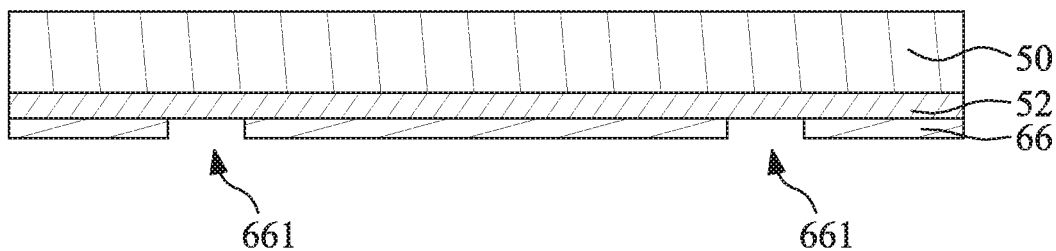

Referring to FIG. 29, a photoresist layer 66 is formed on the metal layer 52. The photoresist layer 66 may be a dry film. Then, the photoresist layer 66 is patterned by, for example, a photolithography process (including exposure and development) to form a plurality of through holes 661 to expose a portion of the first metal layer 52. It is noted that the through holes 661 correspond to the bonding pads 23 of FIG. 5.

Figure 30:
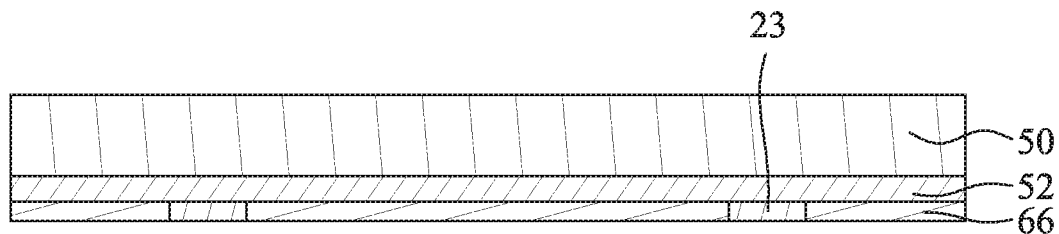

Referring to FIG. 30, a metal (e.g., copper) is deposited or otherwise disposed on the metal layer 52 exposed in the through holes 661 of the photoresist layer 66 to form the bonding pads 23 of FIG. 5.

Figure 31:
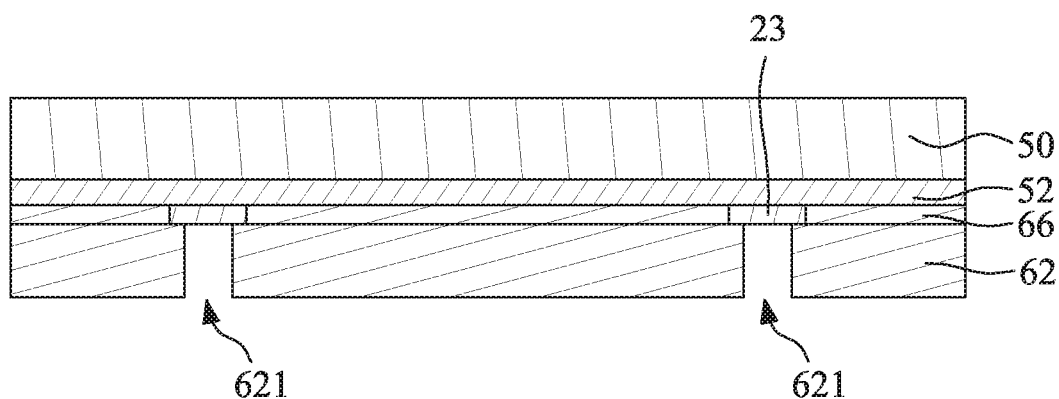

Referring to FIG. 31, the intermediate photoresist layer 62 is formed on the photoresist layer 66 and the bonding pads 23. Then, the intermediate photoresist layer 62 is patterned by, for example, a photolithography process (including exposure and development) to form a plurality of through holes 621 to expose a portion of the bonding pads 23.

Figure 32:
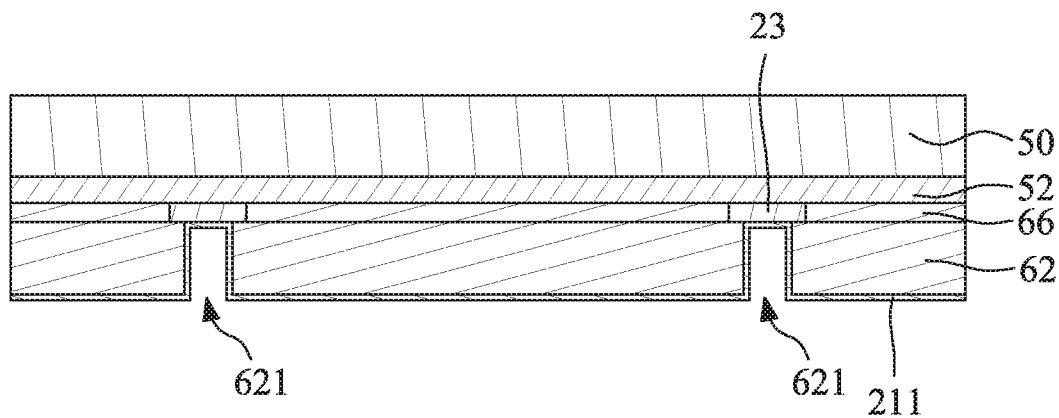

Referring to FIG. 32, the seed layer 211 is formed on the intermediate photoresist layer 62 and in the through holes 621.

Figure 33:
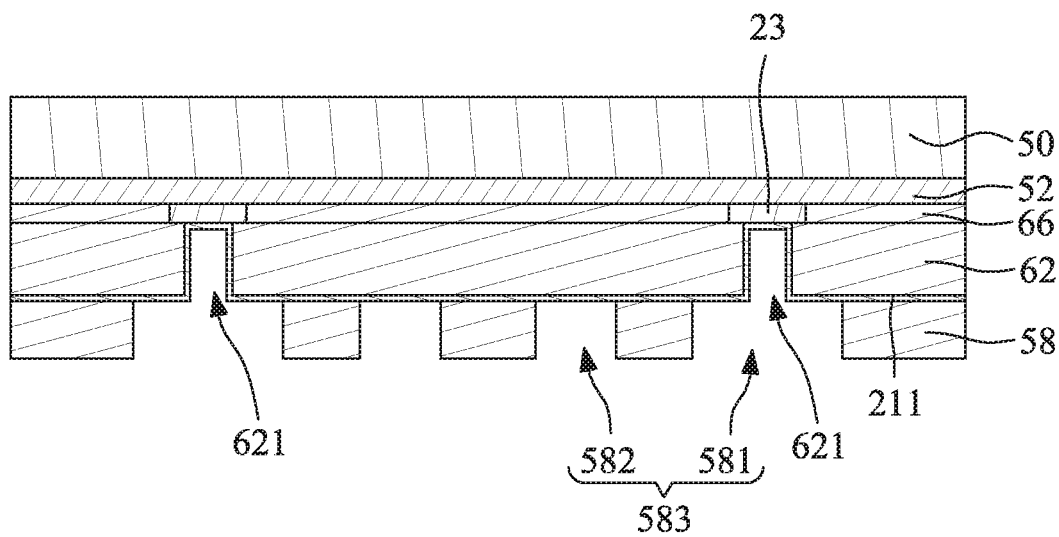

Referring to FIG. 33, the photoresist layer 58 is formed on the seed layer 211 on the intermediate photoresist layer 62. The photoresist layer 58 defines the first pattern 583 including the first openings 581 and the second openings 582. The first openings 581 are communicated and aligned with the through holes 621 of the intermediate photoresist layer 62 to expose the through holes 621. The second openings 582 expose a portion of the seed layer 211 on the intermediate photoresist layer 62.

Figure 34:
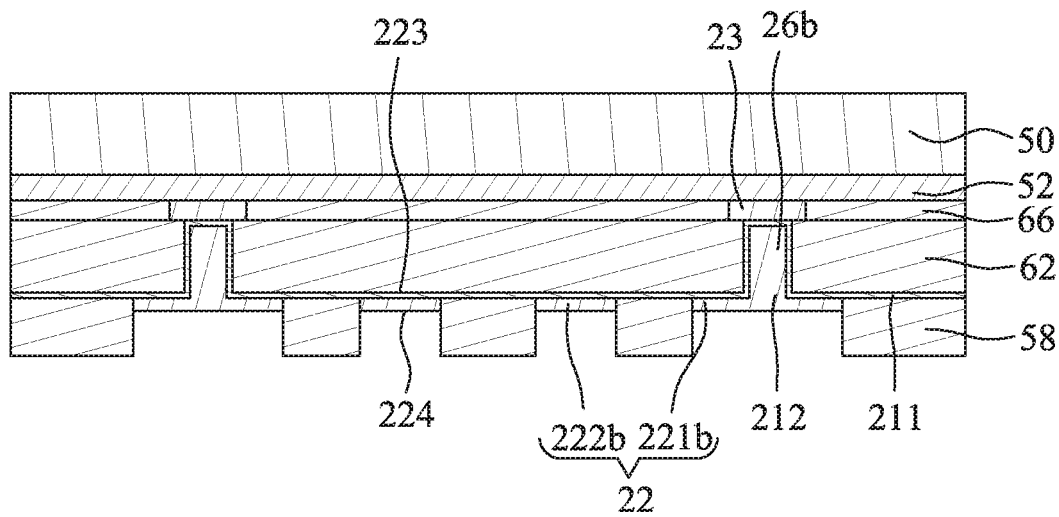

Referring to FIG. 34, a conductive metal portion 212 (e.g., copper) is formed on the seed layer 211 in the first pattern 583 of the photoresist layer 58 and on the seed layer 211 in the through holes 621 of the intermediate photoresist layer 62. The conductive metal portion 212 and the seed layer 211 in the first pattern 583 of the photoresist layer 58 form the first patterned conductive layer 22 including the bump pads 221b and the traces 222b. The conductive metal portion 212 and the seed layer 211 disposed in the through holes 621 of the intermediate photoresist layer 62 forms the conductive posts 26b.

Figure 35:
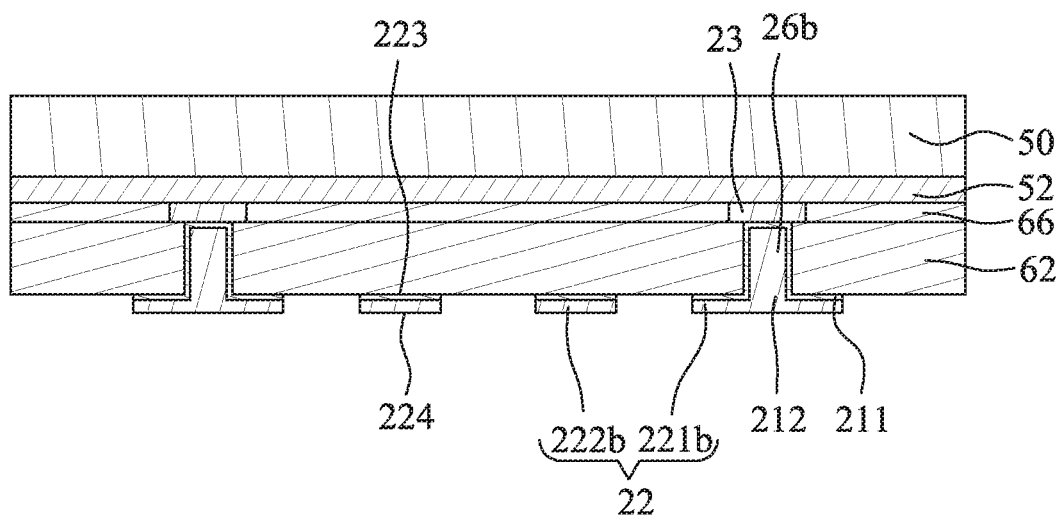

Referring to FIG. 35, the photoresist layer 58 is removed by, for example, stripping. Then, the exposed seed layer 211 is removed by, for example, etching.

Figure 36:
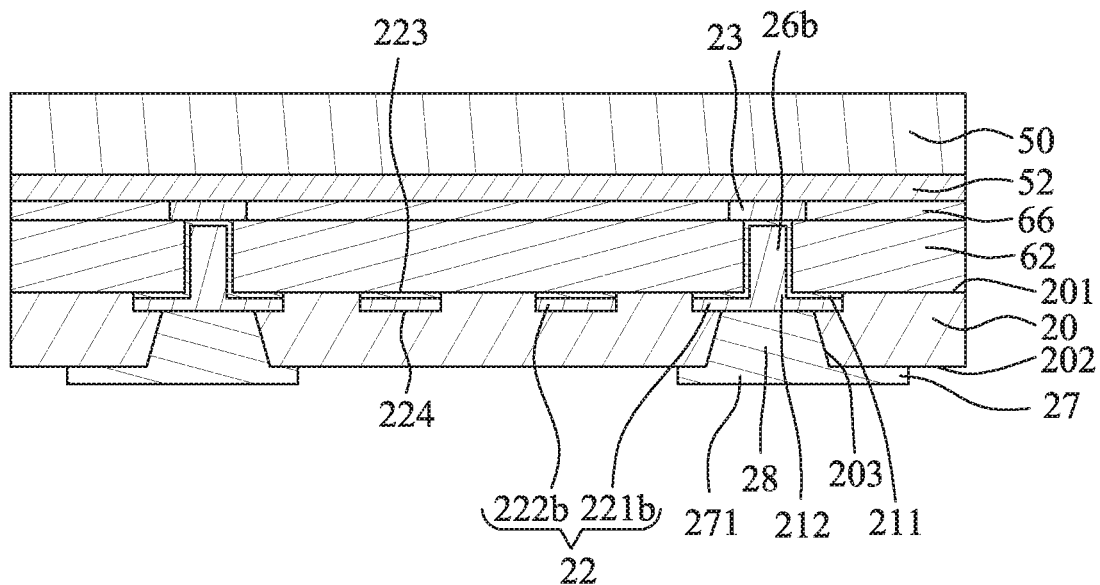

Referring to FIG. 36, the dielectric structure 20 is formed on the intermediate photoresist layer 62 to cover the first patterned conductive layer 22. Then, the conductive vias 28 are formed in the openings 203 of the dielectric structure 20, and the second patterned conductive layer 27 is formed on the second surface 202 of the dielectric structure 20.

Figure 37:
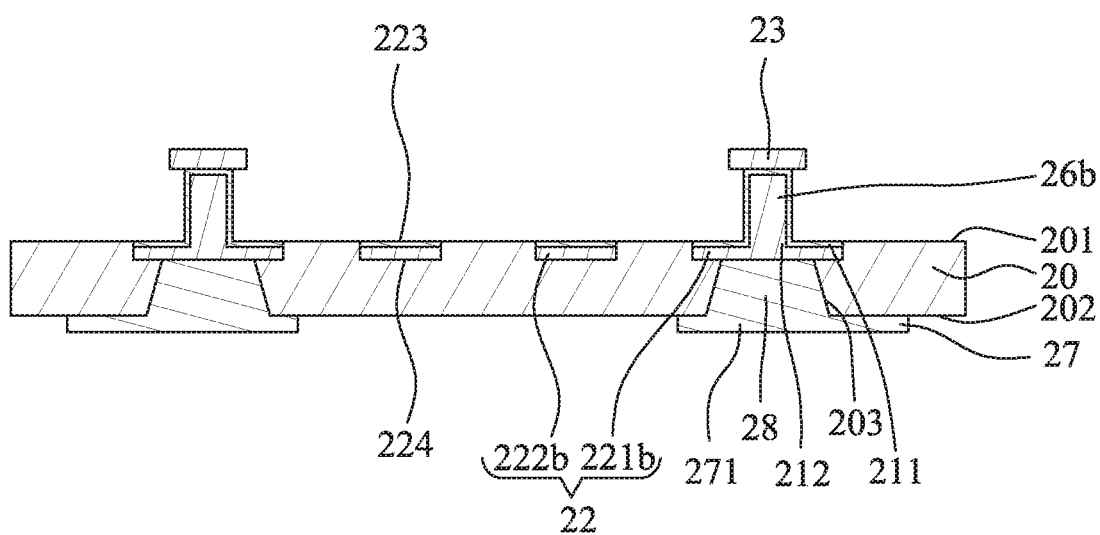

Referring to FIG. 37, the carrier 50 and the metal layer 52 are removed by, for example, etching. Then, the photoresist layer 66 and the intermediate photoresist layer 62 are removed by, for example, stripping.

Then, the following stage is similar to the stage illustrated in FIG. 19 so as to obtain the semiconductor substrate structure 2' of FIG. 5.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the singular terms "a," "an," and "the" may include plural referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

In the description of some embodiments, a component provided "on" or "over" another component can encompass cases where the former component is directly on (e.g., in physical or direct contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a semiconductor substrate structure, comprising
      a dielectric structure;
      a first patterned conductive layer embedded in the dielectric structure;

a first insulation layer disposed on the dielectric structure, wherein the first insulation layer defines an opening exposing the first patterned conductive layer, and the first insulation layer comprises a protrusion portion; and
a conductive post disposed in the opening, wherein the conductive post connects to the first patterned conductive layer and protrudes from the first insulation layer, wherein the first insulation layer has a first thickness at a first position and a second thickness at a second position, the first insulation layer has a first bottom surface at the first position, the first insulation layer has a second bottom surface at the second position, the first bottom surface is substantially coplanar with the second bottom surface, the first position is closer to the conductive post than is the second position, the first thickness is greater than the second thickness, and the protrusion portion of the first insulation layer surrounds the conductive post;
a semiconductor die electrically connected to the conductive post; and
an encapsulant covering the semiconductor die and at least a portion of the semiconductor substrate structure.

2. The semiconductor package according to claim 1, wherein the dielectric structure has a first surface and a second surface opposite to the first surface, the first patterned conductive layer is exposed from the first surface of the dielectric structure, and the first insulation layer is disposed on the first surface of the dielectric structure to cover at least a portion of the dielectric structure.

3. The semiconductor package according to claim 1, wherein a top surface of the protrusion portion from a cross-sectional view is a curved surface.

4. The semiconductor package according to claim 1, wherein the conductive post and the first patterned conductive layer are formed integrally.

5. The semiconductor package according to claim 1, wherein a surface of the conductive post has a surface roughness (Ra) of greater than about 3 μm.

6. The semiconductor package according to claim 1, wherein the conductive post has a consistent width.

7. The semiconductor package according to claim 1, wherein the opening of the first insulation layer is defined by the conductive post.

8. The semiconductor package according to claim 1, wherein the semiconductor substrate structure further comprises:
a plurality of conductive posts disposed in respective openings of the first insulation layer and connected to the first patterned conductive layer; and
a second insulation layer disposed on the first insulation layer, and the second insulation layer defines at least one opening to accommodate at least two conductive posts.

9. The semiconductor package according to claim 1, wherein the semiconductor die comprises a pillar and a connector, the connector is disposed on a tip of the pillar and connects to the conductive post, and a portion of the connector extends to a sidewall of the conductive post.

10. The semiconductor package according to claim 1, wherein the semiconductor substrate structure further comprises a second patterned conductive layer and a plurality of conductive vias, the second patterned conductive layer is disposed on a surface of the dielectric structure away from the first patterned conductive layer, and the conductive vias are disposed in the dielectric structure and electrically connect the first patterned conductive layer and the second patterned conductive layer.

11. The semiconductor package according to claim 1, wherein the first patterned conductive layer includes a bump pad and a trace, and the conductive post and the bump pad of the first patterned conductive layer are formed integrally as a monolithic structure.

12. A semiconductor package, comprising:
a semiconductor substrate structure, comprising a dielectric structure;
a patterned conductive layer embedded in the dielectric structure;
an insulation layer disposed on the dielectric structure, wherein the insulation layer defines an opening exposing the patterned conductive layer; and
a conductive post disposed in the opening, wherein the conductive post connects to the patterned conductive layer and protrudes from the insulation layer, wherein the insulation layer comprises a protrusion portion surrounding the conductive post, a thickness of the protrusion portion decreases with increasing distance from the conductive post, an inclination angle between a top surface of the protrusion portion and a sidewall of the conductive post is less than 90 degrees, and the conductive post and the patterned conductive layer are formed integrally.

13. The semiconductor package according to claim 12, further comprising:
a semiconductor die electrically connected to the conductive post; and
an encapsulant covering the semiconductor die and at least a portion of the semiconductor substrate structure.

14. The semiconductor package according to claim 12, wherein the dielectric structure has a first surface and a second surface opposite to the first surface, the patterned conductive layer is exposed from the first surface of the dielectric structure, and the insulation layer is disposed on the first surface of the dielectric structure to cover at least a portion of the dielectric structure.

15. The semiconductor package according to claim 12, wherein a surface of the conductive post has a surface roughness (Ra) of greater than about 3 μm.

16. The semiconductor package according to claim 12, wherein the patterned conductive layer includes a bump pad and a trace, and the conductive post and the bump pad of the patterned conductive layer are formed integrally as a monolithic structure.

17. The semiconductor package according to claim 12, wherein the opening of the insulation layer is spanned by the conductive post.

* * * * *